(12) United States Patent
Le et al.

(10) Patent No.: US 11,031,253 B2
(45) Date of Patent: Jun. 8, 2021

(54) ETCHING USING AN ELECTROLYZED CHLORIDE SOLUTION

(71) Applicant: IMEC VZW, Leuven (BE)

(72) Inventors: Quoc Toan Le, Belgrade (BE); Henricus Philipsen, Leuven (BE); Frank Holsteyns, Kessel-Lo (BE)

(73) Assignee: IMEC VZW, Leuven (BE)

( * ) Notice: Subject to any disclaimer, the term of this patent is extended or adjusted under 35 U.S.C. 154(b) by 148 days.

(21) Appl. No.: 16/574,902

(22) Filed: Sep. 18, 2019

(65) Prior Publication Data

US 2020/0203181 A1 Jun. 25, 2020

(30) Foreign Application Priority Data

Dec. 24, 2018 (EP) .................................... 18215848

(51) Int. Cl.
   *H01L 21/3213* (2006.01)
   *H01L 21/311* (2006.01)

(52) U.S. Cl.
   CPC .. *H01L 21/32134* (2013.01); *H01L 21/31111* (2013.01)

(58) Field of Classification Search
   None
   See application file for complete search history.

(56) References Cited

U.S. PATENT DOCUMENTS

| | | | |
|---|---|---|---|
| 3,616,349 A * | 10/1971 | Szupillo | C25F 3/02 205/657 |
| 3,992,235 A * | 11/1976 | Garbarini | C23F 1/26 438/754 |
| 4,107,011 A * | 8/1978 | Kucherenko | C23F 1/46 205/755 |
| 5,421,966 A * | 6/1995 | Oxley | C23F 1/46 204/230.3 |
| 5,762,779 A | 6/1998 | Shiramizu et al. | |
| 6,046,110 A | 4/2000 | Hirabayashi et al. | |
| 6,776,919 B2 | 8/2004 | Fukunaga et al. | |
| 6,861,010 B2 | 3/2005 | Hirabayashi et al. | |
| 2002/0056697 A1 | 5/2002 | Westmoreland | |
| 2003/0017419 A1 | 1/2003 | Futase et al. | |
| 2005/0139487 A1* | 6/2005 | Zwicker | C25B 1/30 205/701 |
| 2017/0058408 A1* | 3/2017 | Ye | C25B 1/22 |
| 2018/0148645 A1 | 5/2018 | Lee et al. | |

FOREIGN PATENT DOCUMENTS

EP   1 213 369 A2   6/2002
JP   2007-258274 A  10/2007
(Continued)

OTHER PUBLICATIONS

Aoki, H, et al., "High Rate Etching of Ru and TaN Using Electro-chemical Reaction for Bevel Cleaning", ECS Transactions, 2009, vol. 16(19), pp. 9-14, doi:10.1149/1.3114547.
(Continued)

*Primary Examiner* — Allan W. Olsen
(74) *Attorney, Agent, or Firm* — McDonnell Boehnen Hulbert & Berghoff LLP

(57) ABSTRACT

A method for etching one or more entities on a semiconductor structure, each entity being made of a material selected from metals and metal nitrides is provided. The method includes the steps of: (a) oxidizing by electrolysis, at a current of at least 0.1 A, a precursor solution comprising chloride anions at a concentration ranging from 0.01 mol/l to 1.0 mol/l, thereby forming an etching solution; (b) providing a semiconductor structure having the one or more entities thereon; and (c) etching at least partially the one or more entities by contacting them with the etching solution.

20 Claims, 4 Drawing Sheets

(56) References Cited

FOREIGN PATENT DOCUMENTS

| JP | 2009-081247 A | 4/2009 |
|----|---------------|--------|
| JP | 4867520 B2 | 2/2012 |
| WO | 2014/098392 A1 | 6/2014 |
| WO | 2015/017659 A1 | 2/2015 |
| WO | 2016/140246 A1 | 9/2016 |

OTHER PUBLICATIONS

Briggs, B.D., et al., "Fully Aligned Via Integration for Extendibility of Interconnects to Beyond the 7 nm Node" 2017 IEEE International Electron Devices Meeting (IEDM). IEEE, 2017, pp. 1-4.

Paolillo, S., et al., "Direct Metal Etch of Ruthenium for Advanced Interconnect", Journal of Vacuum Science & Technology B, 2018, vol. 36, 03E103, pp. 1-10, doi:10.1116/1.5022283.

Pley, M., et al., "Two Crystalline Modifications of $RuO_4$", Journal of Solid State Chemistry, 2005, vol. 178(10), pp. 3206-3209.

Segaud, R., et al., "Ruthenium Wet Etch on 200mm MEMS Wafers with Sodium Hypochlorite", ECS Transactions, 2009, vol. 25(5), pp. 329-336, doi:10.1149/1.3202670.

Walker, R.C., et al., "A study of the Anodic Behaviour of Ruthenium by Potential Modulated Reflectance Spectroscopy", Electrochimica Acta, 1998, vol. 44(8-9), pp. 1289-1294.

Extended European Search Report, from the European Patent Office, for European Patent Application No. 18215848.5, dated Jul. 22, 2019, pp. 1-5.

\* cited by examiner

ETCHING USING AN ELECTROLYZED CHLORIDE SOLUTION

CROSS-REFERENCE TO RELATED APPLICATIONS

The present application is a non-provisional patent application claiming priority to European patent application No. 18215848.5, filed Dec. 24, 2018, the contents of which are hereby incorporated by reference.

TECHNICAL FIELD OF THE DISCLOSURE

The present disclosure relates to etching in semiconductor processing and more particularly to wet-chemical etching used therein.

BACKGROUND OF THE DISCLOSURE

In the manufacture of semiconductor devices, there is often a need to etch metals (e.g. Ru) or metal nitrides in various processing steps. These processing steps can, for example, vary from cleaning of a wafer bevel or wafer backside, to removal of a fill metal or metal liner in a damascene trench. Several approaches are known to perform such an etching, they, however, each come with their disadvantages.

Ru can be dry etched using an $O_2$ and $Cl_2$ plasma, as e.g. disclosed by Pley et al. (PLEY, Martin; WICKLEDER, Mathias S. Two crystalline modifications of $RuO_4$. *Journal of Solid State Chemistry*, 2005, 178.10: 3206-3209.) and Paolillo et al. (*J. of Vacuum Science & Technology B* 36, 03E103 (2018)). However, the toxic and volatile gas $RuO_4$ is thereby formed as a by-product. This is frequently considered as a considerable health and safety risk, in turn necessitating an exhaust scrubber and cost-effective procedure for tool chamber cleaning.

Segaud et al. described a wet etching of Ru under alkaline conditions based on sodium hypochlorite (SEGAUD, Roselyne, et al. Ruthenium wet etch on 200 mm MEMS wafers with sodium hypochlorite. *ECS Transactions*, 2009, 25.5: 329-336). However, sodium ions are not compatible with complementary metal-oxide-semiconductor (CMOS) processing.

Walker et al. investigated the anodic oxidation of Ru under both alkaline and acidic conditions (Walker, R. C.; Bailes, M.; Peter, L. M. A study of the anodic behaviour of ruthenium by potential modulated reflectance spectroscopy. *Electrochimica acta*, 1998, 44.8-9: 1289-1294). However, compared to wet-chemical etching, anodic stripping of a metal or metal nitride can have the disadvantage of being dependent on the sheet resistance of the metal or metal nitride and can typically result in a less uniform etching which becomes apparent for instance on 300 mm wafers where an electrical contact can only be made at the wafer edges. Additionally, Walker et al. reported that $RuO_4$ was likely to be formed as an etching product in acidic conditions. Walker et al. also reported the formation of a volatile and toxic etching product ($RuO_4$) in acidic conditions.

US20020056697A1 discloses the etching of ruthenium and ruthenium dioxide using ceric ammonium nitrate in combination with an acid. However, $Ce^{4+}$ is a metastable ion in aqueous solutions, which can react with water in the presence of a catalytic surface (e.g. Pt or Ru) and leaves behind residues of cerium oxide and/or cerium hydroxide. These residues cannot be removed by a simple water rinse, thereby requiring an additional post-etching cleaning step.

There is thus still a need in the art for improved methods to etch metals and/or metal nitrides in semiconductor processing.

SUMMARY OF THE DISCLOSURE

It is an object of the present disclosure to provide an improved way to etch one or more metal and/or metal nitride entities on a semiconductor structure. This objective can be accomplished by a method according to the present disclosure.

It is an advantage of embodiments of the present disclosure that the metal and/or metal nitride entities can be sufficiently (e.g. completely) removed.

It is an advantage of embodiments of the present disclosure that the metal and/or metal nitride entities can be removed selectively with respect to other components of the semiconductor structure (e.g. with respect to a dielectric, such as silicon dioxide or porous low-k materials).

It is an advantage of embodiments of the present disclosure that a variety of metals and/or metal nitrides can be etched.

It is an advantage of embodiments of the present disclosure that the method can be used at a variety of stages in semiconductor processing.

It is an advantage of embodiments of the present disclosure that the used reagents and the obtained reaction products are compatible with semiconductor processing (e.g. CMOS processing); for example, they can be free of alkali and/or earth alkali metals.

It is an advantage of embodiments of the present disclosure that the used chemical reagents and the obtained reaction products can be relatively safe, such as them having a low volatility and being not particularly hazardous.

It is an advantage of embodiments of the present disclosure that entities can be removed while leaving little or even no residues on the uncovered surface. It is a further advantage of embodiments of the present disclosure that any residues left behind can be relatively easily removed, without needing to resort to complicating cleaning steps.

It is an advantage of embodiments of the present disclosure that the etching solution can be prepared under both acidic and alkaline conditions.

It is an advantage of embodiments of the present disclosure that the etching solution can be used under both acidic and alkaline conditions.

It is an advantage of embodiments of the present disclosure that the etching solution can be provided with one or more additives (e.g. a complexing agent and/or an activating agent) which can facilitate removal of the entities and/or extent the type of entities that can be removed.

It is an advantage of embodiments of the present disclosure that the method is relatively economical.

In a first aspect, the present disclosure relates to a method for etching one or more entities on a semiconductor structure, each entity being made of a material selected from metals and metal nitrides, the method comprising the steps of: (a) oxidizing by electrolysis, at a current of at least 0.1 A, a precursor solution comprising chloride anions at a concentration ranging from 0.01 mol/l to 1.0 mol/l thereby forming an etching solution, (b) providing a semiconductor structure having the one or more entities thereon, and (c) etching at least partially the one or more entities by contacting them with the etching solution.

In a further aspect, the present disclosure relates to a method for etching a plurality of entities on a semiconductor structure, at least one entity being made of a material selected from metals and metal nitrides and at least another entity being made of a metal oxide.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
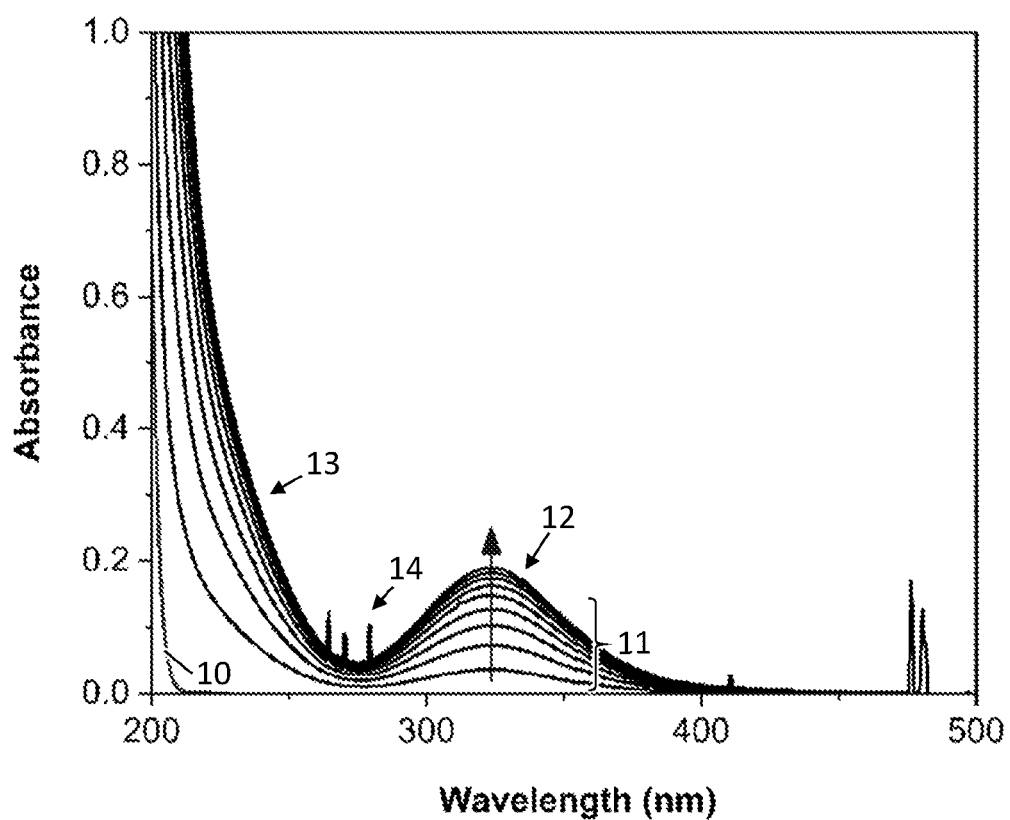
FIGS. 1 and 4 show absorption spectra in accordance with exemplary embodiments of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosure aspects. This method of disclosure, however, is not to be interpreted as reflecting an intention that the claimed disclosure requires more features than are expressly recited in each claim. Rather, as the following claims reflect, disclosure aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

The following terms are provided solely to aid in the understanding of the disclosure.

As used herein, and unless otherwise specified, the potency of an etching solution of the present disclosure can be seen in the speed at which it is able to etch a metal and/or metal nitride entity. The potency of the etching solution typically correlates with the concentration of active oxidizing species therein. The etching solution potency, together with its volume, can also play a role in the amount of metal or metal nitride that can be etched by it.

In a first aspect, the present disclosure relates to a method for etching one or more entities on a semiconductor structure, each entity being made of a material selected from metals and metal nitrides, the method comprising the steps of: (a) oxidizing by electrolysis, at a current of at least 0.1 A, a precursor solution comprising chloride anions at a concentration ranging from 0.01 mol/l to 1.0 mol/l thereby forming an etching solution, (b) providing a semiconductor structure having the one or more entities thereon, and (c) etching at least partially the one or more entities by contacting them with the etching solution.

In embodiments, the semiconductor structure may be a semiconductor substrate (e.g. a semiconductor wafer). In embodiments, the semiconductor substrate may be a Si wafer with a $SiO_2$ or a porous low-k dielectric layer thereon. The method may, for example, be used to etch metal and/or metal nitride entities during manufacturing of a semiconductor device (e.g. a field-effect transistor or an interconnect) or during cleaning of a wafer bevel and/or wafer backside.

In embodiments, the metals may be selected from the list consisting of ruthenium, copper, molybdenum, titanium, rhodium, tantalum, and iridium. In embodiments, the metal nitride may be a transition metal nitride. In embodiments, the metal nitrides may be selected from the list consisting of aluminum nitride, titanium nitride and tantalum nitride.

In embodiments, the precursor solution may comprise chloride anions at a concentration ranging from 0.02 mol/l to 0.5 mol/l, generally from 0.05 mol/l to 0.2 mol/l, such as 0.1 mol/l.

In some embodiments, the precursor solution in step (a) may have a pH of at most 7, generally at most 5, usually at most 3. For instance, the pH may range from 0 to 7 or from 0 to 3. In such embodiments, the precursor solution may comprise HCl; or it may comprise another acid, such as sulphuric acid ($H_2SO_4$), nitric acid ($HNO_3$), acetic acid ($CH_3COOH$) or methane sulphonic acid ($CH_3SO_3H$), and a source of chloride. Electrolyzing an acidic or neutral precursor solution may advantageously be easier and/or more practical than electrolyzing an alkaline precursor solution. Typically, neutral or acidic solutions have greater potency than basic solutions.

In other embodiments, the etching solution may have a pH above 7, generally at least 9, usually at least 11. For instance, the pH may range from 7.5 to 11. Basic solutions can be less prone to the formation of $RuO_4$, which can be toxic. In such embodiments, the precursor solution may comprise $NH_4Cl$ or an organic ammonium chloride, and optionally $NH_4OH$, NaOH, KOH or an organic ammonium hydroxide. In embodiments, the organic ammonium chloride may be a tetraalkylammonium chloride (e.g. tetramethylammonium chloride or tetraethylammonium chloride). In embodiments, the organic ammonium hydroxide may be a tetraalkylammonium hydroxide (e.g. tetramethylammonium hydroxide, TMAH, or tetraethylammonium hydroxide, TEAH). In some embodiments, TEAH may be used instead of TMAH as can be less toxic.

In embodiments, the precursor solution may further comprise a supporting electrolyte. Supporting electrolytes advantageously allow to elevate the conductivity (i.e. lower the resistance) of the precursor solution. Examples of supporting electrolytes are ammonium salts.

In embodiments, step (a) may be performed at a potential of at least +1.1 V, generally at least +1.5 V, versus Ag/AgCl. After electrolysis in step (a), the etching solution advantageously contains an oxidizing species (herein also referred to as the 'active oxidizing species') with a reduction onset potential more positive than the anodic stripping potential of the to-be-etched metal and/or metal nitride (e.g. more positive than +1.1 V vs Ag/AgCl for etching Ru). For instance, HClO has a reduction potential of 1.49 V vs Ag/AgCl. However, an overvoltage can be typically needed for a sufficient amount of oxidizing species to be generated. This overvoltage can depend much on the particular electrolysis set up used (e.g. type of electrodes). Therefore, in practice, a potential ranging from 2.5 to 10 V, such as from 5 to 10 V, can be used.

In embodiments, the precursor solution may be an aqueous solution. In embodiments, the etching solution may comprise HCl and dissolved $Cl_2$. However, the etching solution may typically not be a mere mixture of HCl and $Cl_2$. It was observed that a mixture of dissolved $Cl_2$ gas in an HCl solution may not have the same etching capabilities as an etching solution obtained by electrolysis. The electrolysis may, for instance, generate a further oxidizing species (e.g. HClO).

In embodiments, the current in step (a) may be at least 0.4 A, generally at least 0.8 A, such as 1 A or more. It was observed that the potency of etching solution can advantageously be higher for a higher applied electrolysis current.

In embodiments, step (a) may be performed for a duration of at least 5 min, at least 10 min, at least 20 min, at least 30 min, or at least 45 min. It was observed that, at least within the time period up to 45 min, the potency of the etching solution can advantageously increase for increasing electrolysis time.

In embodiments, a two electrodes set-up may be used for step (a).

In embodiments, the electrolysis may be performed using electrodes selected from the group of platinized titanium, graphite, doped diamond and a dimensionally stable anode (DSA). In some embodiments, the electrolysis may be performed using a doped diamond electrode, such as a boron-doped diamond (BDD) electrode (as e.g. purchasable from CONDIAS).

In embodiments, the one or more entities may not be in contact with the precursor solution during step (a). The etching solution is advantageously prepared separately from the metal and/or metal nitride entities. In other words, in embodiments, step (c) may be performed after step (a) is terminated or discontinued.

In embodiments, the precursor solution and/or the etching solution may each comprise a concentration in combined alkali metal and alkaline earth metal ranging from 0 to 0.001 mol/l. In embodiments, the precursor solution and/or the etching solution each may comprise an atomic ratio Cl (alkali metal+alkaline earth metal) of at least 2, generally at least 5, usually at least 10. Alkali metals and alkaline earth metals are typically not compatible with semiconductor processing (e.g. CMOS manufacturing) and are therefore advantageously avoided in the etching solution.

In embodiments, the etching solution may be an aqueous solution.

In embodiments, the etching solution may not be outgassed (actively or passively) prior to step (c). It was observed that outgassing the etching solution can lower its potency. In embodiments, the etching solution may have a shelf life of at least 30 min, at least 1 hour, 2 hours, or up to 3 hours. After electrolysis in step (a), the etching solution typically gradually loses its potency over time (e.g. by passive outgassing).

In embodiments, step (c) may be performed within 3 hours, within 2 hours, within 1 hour or within 30 minutes of the discontinuation of step (a).

In some embodiments, the etching solution may have a pH of at most 7, generally at most 5, and usually at most 3. In other embodiments, the etching solution may have a pH above 7, generally at least 9, and usually at least 11.

In some embodiments, the method may further comprise a step (a'), after step (a) and before step (c), of adjusting the pH of the etching solution to a pH above 7, generally at least 9, and usually at least 11. For instance, the pH may be adjusted to range from 7.5 to 11. In such embodiments, adjusting the pH of the etching solution may comprise a step of providing the etching solution with $NH_4OH$, KOH, NaOH or an organic ammonium hydroxide. In embodiments, the organic ammonium chloride may be an alkylammonium chloride such as a tetraalkylammonium chloride (e.g. tetramethylammonium chloride or tetraethylammonium chloride). In embodiments, the organic ammonium hydroxide may be an alkylammonium hydroxide such as a tetraalkylammonium hydroxide (e.g. tetramethylammonium hydroxide, TMAH, or tetraethylammonium hydroxide, TEAH). In some embodiments, TEAH may be used instead of TMAH as it is less toxic.

In other embodiments, the method may further comprise a step (a'), after step (a) and before step (c), of adjusting the pH of the etching solution to a pH of at most 7, generally at most 5, and usually at most 3. For instance, the pH may be adjusted to a pH ranging from 0 to 7, such as from 0 to 3. In such embodiments, adjusting the pH of the etching solution may comprise a step of providing the etching solution with sulphuric acid ($H_2SO_4$), nitric acid ($HNO_3$), acetic acid ($CH_3COOH$) or methane sulphonic acid ($CH_3SO_3H$).

In embodiments, step (c) may comprise contacting the one or more entities with the etching solution for a duration of at least 30 s, at least 1 min, at least 5 min, at least 10 min, at least 20 min, at least 30 min, or at least 45 min. It was observed that the completeness of the etching (i.e. the amount of metal and/or metal nitride removed) advantageously increases for increasing etching time. Nevertheless, it will be clear that the ideal etching time depends on numerous factors, such as the potency of the etching solution (e.g. the electrolysis time and current), the volume of the etching solution, the geometry of the one or more entities (e.g. the layer thickness), the hydrodynamics during etching (e.g. the rotation rate of the semiconductor structure), etc.

In embodiments, at least one of the one or more entities may be a layer lining a cavity. In embodiments, the cavity may be a trench (e.g. a damascene trench). In embodiments, the layer lining the cavity may be a Ru layer. In embodiments, a plurality of layers may line the cavity, such as a Ru layer on a metal nitride (e.g. TaN or TiN) layer. In embodiments, the one or more entities may comprise one or more layers lining the cavity and a metal filling the cavity, and step (c) may etch a top portion of at least one of the one or more layers lining the cavity and may etch a top portion of the metal filling the cavity. In embodiments, the metal filling the cavity may be Cu or Ru. If the filling metal is Ru, the cavity may be filling the cavity without the presence of a lining layer or the cavity may be lined with a metal nitride layer and the cavity may be filled with Ru.

In embodiments, the one or more entities may comprise a copper portion on a ruthenium portion and step (c) may etch at least part of the copper portion and at least part of the ruthenium portion. In embodiments, the one or more entities may comprise a copper portion on a ruthenium portion, itself on a metal nitride (e.g. TaN) portion, and wherein step (c) etches at least part of the copper portion, at least part of the ruthenium portion, and at least part of the metal nitride portion.

In embodiments, the method may further comprise a step (before step (c) or during step (c)) of providing the precursor solution or the etching solution with a compound for dissolving a metal oxide. For instance, the metal oxide may be a transition metal oxide such as a tantalum oxide (e.g. $Ta_2O_5$) or a titanium oxide (e.g. $TiO_2$). For instance, fluorine ions may be provided. An example of a source of fluorine ions is $NH_3F$. Several metals are prone to develop a metal oxide layer on their surface, which acts as a passivating layer. It can be therefore advantageous if the etching solution can dissolve the metal oxide from the to-be-etched entities, thereby activating them for further etching. Hence, in a further aspect, the present disclosure may relate to a method for etching a plurality of entities on a semiconductor structure, at least one entity being made of a material selected from metals and metal nitrides while at least another entity being made of a metal oxide. In embodiments, the plurality of entities may comprise at least one entity being made of a metal or a metal nitride, said entity being in contact with another entity being made of a metal oxide. The method may comprise the steps of: (a) oxidizing by electrolysis, at a current of at least 0.1 A, a precursor solution comprising chloride anions at a concentration ranging from 0.01 mol/l to 1.0 mol/l thereby forming an etching solution, (b) providing a semiconductor structure having the plurality of entities thereon, and (c) etching at least partially the one or more entities by contacting them with the etching solution, wherein the method further comprise a step, before step (c) or during step (c), of providing the precursor solution or the etching solution with a compound for dissolving a metal oxide. Any feature of this further aspect may be as correspondingly described for any embodiments of the first aspect of the present disclosure.

In embodiments, the method may further comprise a step of providing the precursor solution or the etching solution with a compound for complexing a metal ion from the metal and/or metal nitride. By complexing such a metal ion, it is advantageously more easily dissolved and kept in solution, thereby facilitating etching and impeding the formation of residues (e.g. oxides or hydroxides) of such a metal ion on the surface of the semiconductor structure.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

Example 1: Electrolysis of a Chloride Solution to Form an Etching Solution

Example 1a: Preparation of the Etching Solution

In order to form an etching solution in accordance with an embodiment of the present disclosure, a glass beaker was first filled with a 0.1 M HCl aqueous solution (e.g. 200 ml or 500 ml). Two electrodes were then positioned in the beaker, separated from one another by about 5 cm. The electrodes used were boron-doped diamond (BDD) electrodes on a Nb substrate (with a thickness of 2 mm and a size of 10×5 cm), purchased from CONDIAS. The HCl solution was then electrolyzed, typically at a current of 1.0 A, for a duration of between 10 and 30 min.

Example 1b: In Situ UV-Vis Spectroscopy of the Preparation

Figure 2:
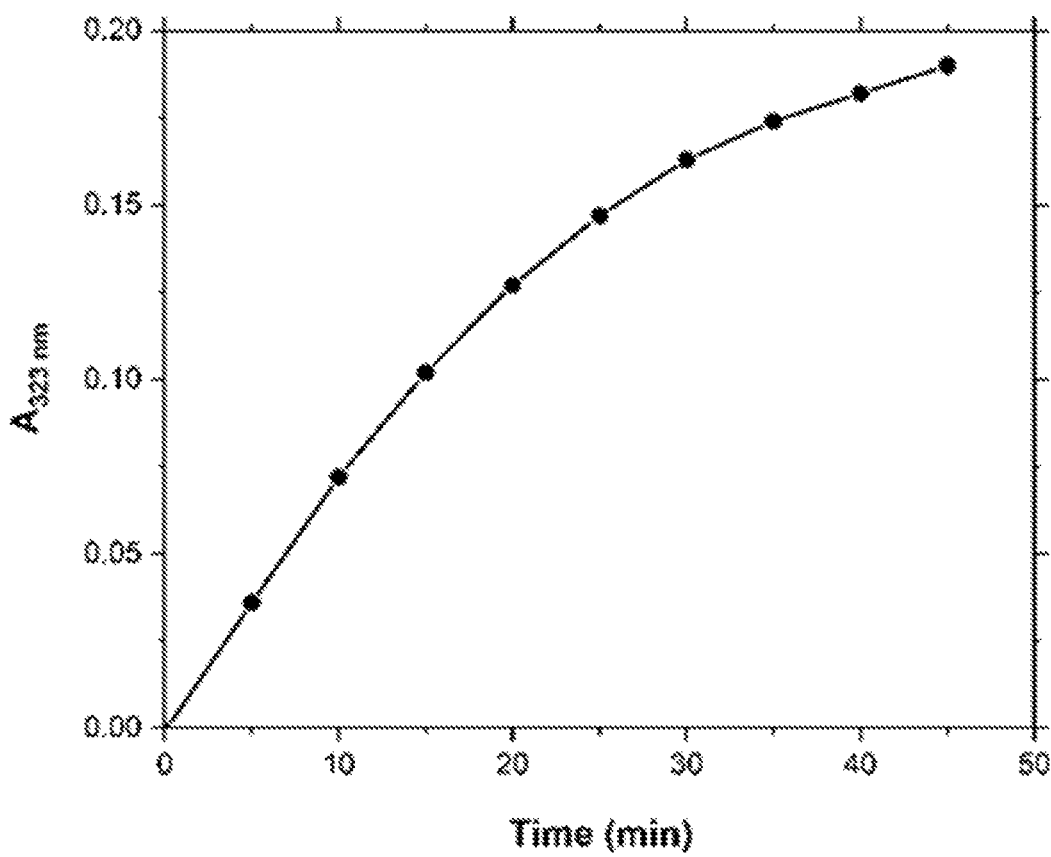
FIGS. 2 and 3 show transients of the absorbance at 323 nm in accordance with exemplary embodiments of the present disclosure.

FIGS. 1 and 2 are referenced in this Example. Reference curve 10 shows the absorption spectrum of a 0.1 M HCl solution before performing electrolysis. Curves 11 correspond to the absorption spectra of the 0.1 M HCl solution measured during electrolysis, every 5 minutes for a total duration of 45 minutes. The arrow indicates the increasing intensity for increasing electrolysis time; in other words, the bottom curve of spectra 11 corresponds to the absorption spectrum after 5 min of electrolysis, whereas the top curve corresponds to the absorption spectrum after 45 min of electrolysis.

The peak 12 at 323 nm was tentatively ascribed to dissolved $Cl_2$; the graph in FIG. 2 shows a more detailed view of the absorbance at 323 nm as a function of time. The chemical species responsible for the tail 13 between 200 and 275 nm was not conclusively elucidated; though it is expected that it corresponds to a further electrolysis product (which may potentially be a major oxidizing species in the etching solution). Both these features (i.e. peak 12 and tail 13) arise during electrolysis and, at least within the measured time period, increase with increasing electrolysis time. This is in line with e.g. the Ru etching experiments (cf. example 2a), which indicate a faster etching (i.e. a more potent etching solution) when the solution is electrolysed for a longer duration.

The spikes 14 in some of the spectra are due to gas bubbles crossing the light beam inside the flow cell, which blocked the light for a brief moment.

Example 2: Etching of Metals and/or Metal Nitrides Using the Etching Solution

Example 2a: Sheet Resistance Measurements and Visual Examination of the Etching of Ru For the etching studies, semiconductor structure was provided for each sample consisting of a stack of blanket layers, i.e. not patterned, of nominally 10 nm Ru, 3 nm TaN and 300 nm $SiO_2$ on a Si wafer. The Ru was deposited by chemical vapour deposition (CVD) and the semiconductor structures were not annealed. Each semiconductor structure was positioned in a sample holder with an O-ring, which defined an exposed surface area of 0.95 cm². The exposed surface was then contacted to an etching solution according to Example 1a for a duration ranging between 10 and 30 min, while rotating the semiconductor structure at 500 rpm. After the etching, the sheet resistance of the semiconductor structure was measured. These sheet resistance measurements are further supported with a visual investigation of the sample. Here, the semiconductor structure surface was characterized by a highly reflective silvery surface prior to etching. This changed to a blue appearance for complete etching, indicated that the Ru metal and TaN metal nitride were removed and the underlying $SiO_2$ layer is visible.

Different samples corresponding to different electrolysis times (cf. example 1a) and different etching times are listed in the table below, together with their measured sheet resistance. A reference sample is also included, which corresponds to a semiconductor structure as defined above which was not exposed to an etching solution. For comparison: the sheet resistance of an as-deposited blanket 3 nm TaN layer amounts to about 730 Ω/sq.

| Sample | Electrolysis time (min) | Etch time (min) | Sheet resistance (Ω/sq) |
| --- | --- | --- | --- |
| 1 | 10 | 10 | 58.76 |
| 2 | 10 | 20 | 93.83 |
| 3 | 10 | 30 | 127.56 |
| 4 | 20 | 10 | 116.33 |

-continued

| Sample | Electrolysis time (min) | Etch time (min) | Sheet resistance (Ω/sq) |
| --- | --- | --- | --- |
| 5 | 20 | 20 | — |
| 6 | 20 | 30 | — |
| 7 | 30 | 10 | 525 |
| 8 | 30 | 20 | — |
| 9 | 30 | 30 | — |
| Reference | / | / | 30.2 |

For samples 5, 6, 8 and 9, no sheet resistance could be measured. This was tentatively attributed to a full etching of the Ru and TaN. Alternatively, this result could be explained by an etching of the Ru in combination with the presence of a residue (e.g. a Ru oxide and/or hydroxide) preventing to measure the sheet resistance of the remaining TaN.

For sample 1, it was thus observed that the sheet resistance increases from about 30 (cf. reference sample) to about 59, indicating removal of Ru. Visually, the highly reflective silvery sample surface had darkened considerably. For samples 2 and 3, the sheet resistance increased further, in line with the expectation that more Ru is etched away. A similar trend of a more complete etching for longer etching times was observed for electrolysis times of 20 and 30 min.

Likewise, for samples 1, 4 and 7 with an etching time of 10 min, a clear increase in sheet resistance was seen for longer electrolysis times, indicating that more Ru was etched due to a higher concentration of oxidizing species which was formed during a longer electrolysis time. A similar trend was observed for etching times of 20 and 30 min. It was therefore observed that, within the measured range, the potency of the etching solution raised for increasing electrolysis time.

Example 2b: In Situ UV-Vis Spectroscopy of the Etching of Cu

Figure 3:
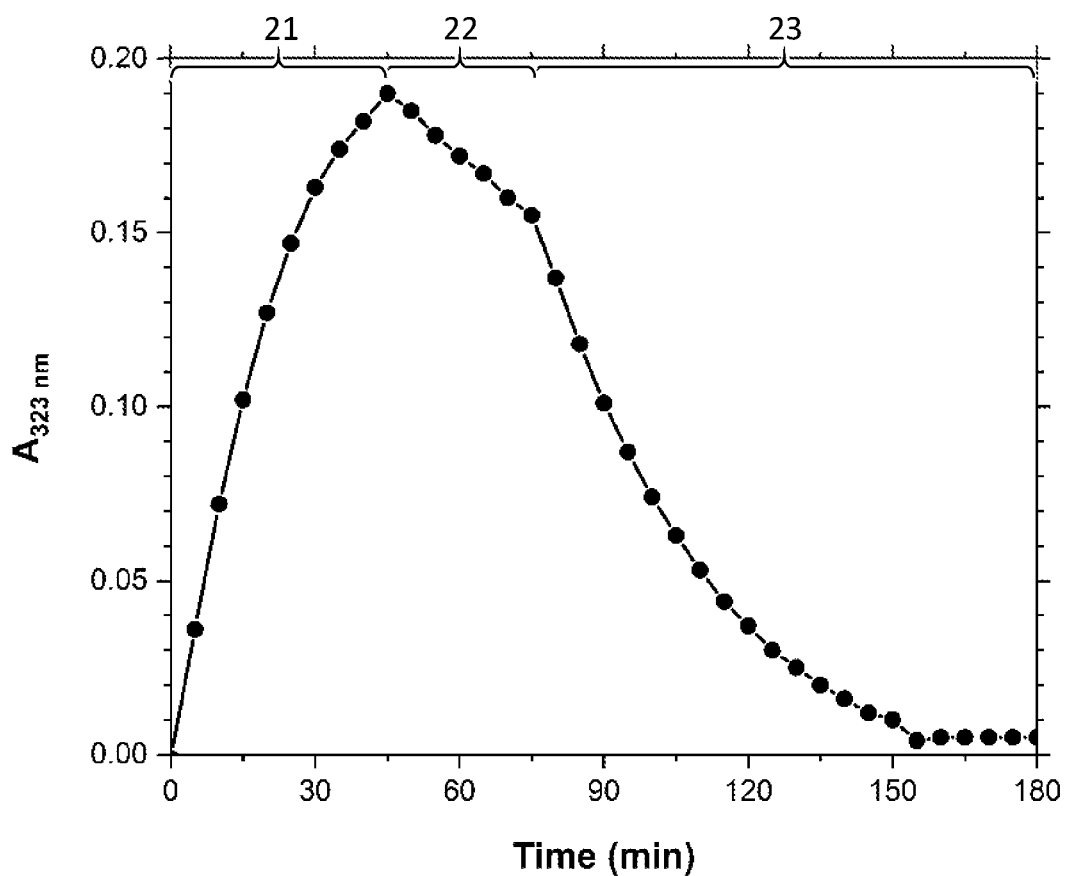

FIG. 3 shows a transient of the absorbance at 323 nm. Stage 21 of the transient matches the graph of FIG. 2, corresponding to electrolysis of the chloride solution and thereby a progressively increasing intensity. In stage 22 (i.e. 45-75 min), the electrolysis current was interrupted and a gradual decay in intensity was observed. This decay was tentatively ascribed to a slow outgassing of the dissolved $Cl_2$.

While monitoring the solution decay, a Cu foil was added to the beaker at stage 23. This resulted in the dissolution of the metal and thereby an increased decay of the absorption peak for the dissolved $Cl_2$.

Figure 4:
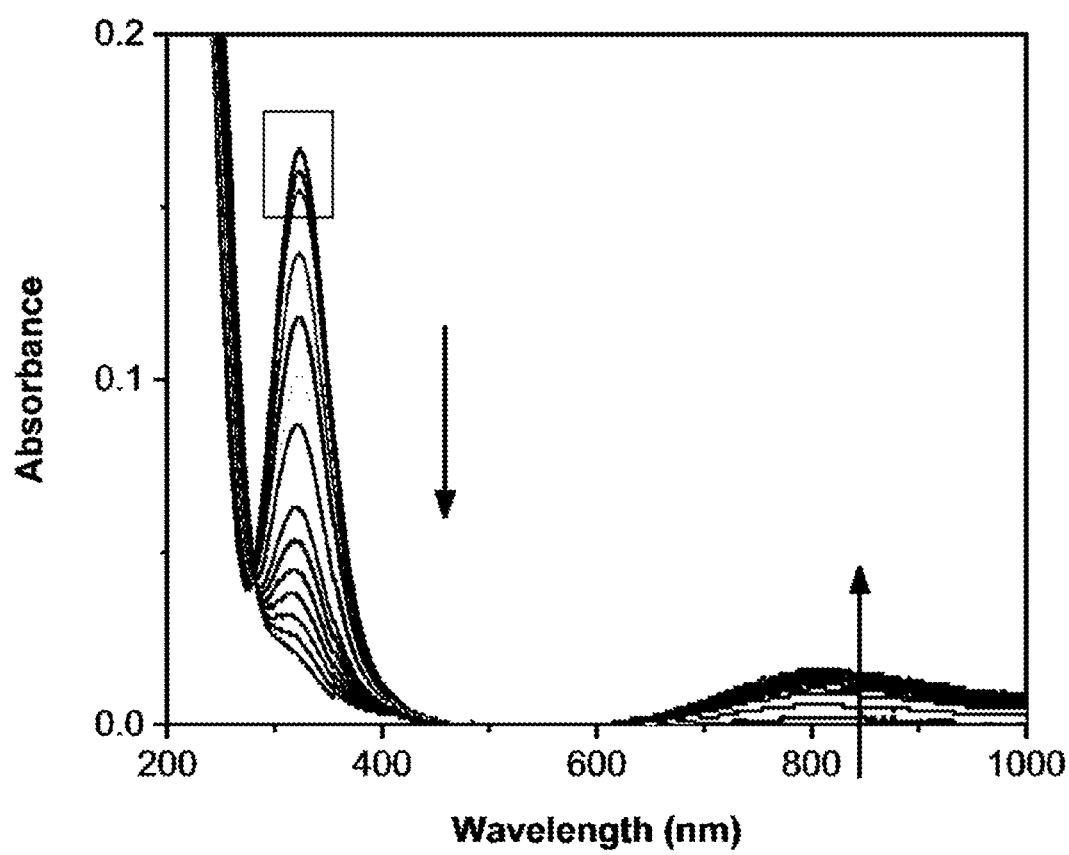

FIG. 4 shows the absorption spectra measured in stages 22 and 23. The slow decay in the absorption peak at 323 nm during stage 22, attributed to outgassing, is marked with a box; while arrows show the observed trend during stage 23. As expected, a new feature around 800 nm appears, attributed to the generation of $Cu^{2+}$ as the etching of the metallic Cu progressed.

It is to be understood that although various embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for etching one or more entities on a semiconductor structure, each entity being made of a material selected from metals and metal nitrides, the method comprising the steps of:
   (a) oxidizing by electrolysis, at a current of at least 0.1 A, a precursor solution comprising chloride anions at a concentration ranging from 0.01 mol/l to 1.0 mol/l thereby forming an etching solution;
   (b) providing a semiconductor structure having the one or more entities thereon; and
   (c) etching at least partially the one or more entities by contacting them with the etching solution.

2. The method according to claim 1, wherein the metals are selected from the group consisting of ruthenium, copper, molybdenum, titanium, rhodium, tantalum, and iridium, and wherein the metal nitrides are selected from the group consisting of aluminum nitride, titanium nitride and tantalum nitride.

3. The method according to claim 1, wherein the one or more entities comprise a copper portion on a ruthenium portion and wherein step (c) etches at least part of the copper portion and at least part of the ruthenium portion.

4. The method according to claim 1, further comprising a step of providing the precursor solution or the etching solution with an ammonium hydroxide or an organic ammonium hydroxide.

5. The method according to claim 1, further comprising a step of providing the precursor solution or the etching solution with a compound for dissolving a metal oxide.

6. The method according to claim 1, further comprising a step of providing the precursor solution or the etching solution with a compound for complexing the metal.

7. The method according to claim 1, wherein the one or more entities comprise a copper portion on a ruthenium portion, itself on a metal nitride portion, and wherein step (c) etches at least part of the copper portion, at least part of the ruthenium portion, and at least part of the metal nitride portion.

8. The method according to claim 1, with the proviso that the one or more entities are not in contact with the precursor solution during step (a).

9. The method according to claim 1, wherein the current in step (a) is at least 0.4 A.

10. The method according to claim 1, wherein the current in step (a) is at least 0.8 A.

11. The method according to claim 1, wherein the precursor solution in step (a) has a pH of at most 7.

12. The method according to claim 1, wherein the precursor solution in step (a) has a pH of at most 5.

13. The method according to claim 1, wherein the precursor solution in step (a) has a pH of at most 3.

14. The method according to claim 11, further comprising a step (a'), after step (a) and before step (c), of adjusting the pH of the etching solution to a pH above 7.

15. The method according to claim 11, further comprising a step, after step (a') and before step (c) of adjusting the pH of the etching solution to a pH of at least 9.

16. The method according to claim 11, further comprising a step (a'), after step (a) and before step (c) of adjusting the pH of the etching solution to a pH of at least 11.

17. The method according to claim 1, wherein the electrolysis is performed using a doped diamond electrode.

18. The method according to claim 1, wherein the precursor solution and the etching solution are aqueous solutions.

19. The method according to claim 1, wherein at least one of the one or more entities is a layer lining a cavity.

20. The method according to claim 19, wherein the one or more entities comprise one or more layers lining the cavity and a metal filling the cavity, and wherein step (c) etches a top portion of at least one of the one or more layers lining the cavity and etches a top portion of the metal filling the cavity.

* * * * *